(12) United States Patent
Jeddeloh et al.

(10) Patent No.: US 7,328,381 B2
(45) Date of Patent: Feb. 5, 2008

(54) TESTING SYSTEM AND METHOD FOR MEMORY MODULES HAVING A MEMORY HUB ARCHITECTURE

(75) Inventors: Joseph M. Jeddeloh, Shoreview, MN (US); Robert Totorica, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 72 days.

(21) Appl. No.: 11/195,035

(22) Filed: Aug. 1, 2005

(65) Prior Publication Data

US 2007/0038907 A1  Feb. 15, 2007

(51) Int. Cl.
*G11C 29/00* (2006.01)
*H03M 13/00* (2006.01)

(52) U.S. Cl. .................. 714/718; 714/758; 714/42

(58) Field of Classification Search .............. None
See application file for complete search history.

(56) References Cited

U.S. PATENT DOCUMENTS

| | | | |
|---|---|---|---|
| 4,637,020 A | 1/1987 | Schinabeck | 371/20 |
| 4,646,299 A | 2/1987 | Schinabeck et al. | 371/20 |
| 4,717,012 A | 1/1988 | Swapp et al. | 198/425 |
| 4,776,747 A | 10/1988 | Swapp et al. | 414/417 |
| 4,928,062 A | 5/1990 | Miles et al. | 324/158 R |
| 5,055,779 A | 10/1991 | Kerschner et al. | 324/158 F |
| 5,321,702 A | 6/1994 | Brown et al. | 714/744 |
| 5,539,305 A | 7/1996 | Botka | 324/158.1 |
| 5,652,524 A | 7/1997 | Jennion et al. | 324/765 |
| 5,751,151 A | 5/1998 | Levy et al. | 324/537 |
| 5,805,619 A | 9/1998 | Gardner et al. | 714/814 |
| 5,864,565 A | 1/1999 | Ochoa et al. | 371/24 |
| 5,903,163 A | 5/1999 | Tverdy et al. | 324/760 |
| 6,004,142 A | 12/1999 | Wark | 439/74 |
| 6,087,857 A | 7/2000 | Wang | 327/5 |
| 6,147,506 A | 11/2000 | Ahmad et al. | 324/760 |
| 6,219,305 B1 | 4/2001 | Patrie et al. | 368/113 |
| 6,369,601 B1 | 4/2002 | Ishigaki | 324/765 |
| 6,373,268 B1 | 4/2002 | Dunlap et al. | 324/755 |
| 6,407,567 B1 | 6/2002 | Etter | 324/760 |
| 6,438,721 B1 | 8/2002 | Wente | 714/731 |
| 6,449,741 B1 | 9/2002 | Organ et al. | 714/724 |
| 6,551,844 B1 | 4/2003 | Eldridge et al. | 438/14 |
| 6,583,636 B2 | 6/2003 | Brule | 324/755 |
| 6,631,488 B1 * | 10/2003 | Stambaugh et al. | 714/746 |
| 6,696,848 B2 | 2/2004 | Robinson | 324/755 |
| 6,791,317 B1 | 9/2004 | Walsh et al. | 324/158.1 |
| 6,829,181 B1 | 12/2004 | Seitoh | 365/201 |
| 6,856,154 B2 | 2/2005 | Song et al. | 324/754 |

(Continued)

*Primary Examiner*—Phung M. Chung
(74) *Attorney, Agent, or Firm*—Dorsey & Whitney, LLP

(57) ABSTRACT

A testing method and system is used to test memory modules each of which has a memory hub coupled to a plurality of memory devices. The testing system and method includes a test interface circuit having a memory interface that is coupled to transmit and receive memory signals to and from a tester through a memory bus. The test interface circuit couples test signals to the memory hub in the memory module through a communications link responsive to command, address and data signals received from the tester. The test interface circuit also receives signals from the memory hub in the memory module through the communications link that are indicative of the response of the memory module to the test signals. The test interface circuit then provides corresponding results data to the tester.

17 Claims, 6 Drawing Sheets

U.S. PATENT DOCUMENTS

| | | | |
|---|---|---|---|
| 7,188,219 B2* | 3/2007 | Jeddeloh | 711/154 |
| 7,213,082 B2* | 5/2007 | Jeddeloh | 710/5 |
| 7,234,070 B2* | 6/2007 | James | 713/503 |
| 7,243,278 B2 | 7/2007 | Arkin | 714/724 |
| 2004/0034825 A1* | 2/2004 | Jeddeloh | 714/733 |
| 2005/0023560 A1* | 2/2005 | Ahn et al. | 257/200 |
| 2005/0060600 A1* | 3/2005 | Jeddeloh | 714/5 |
| 2005/0278495 A1* | 12/2005 | Lee | 711/168 |
| 2005/0283681 A1* | 12/2005 | Jeddeloh | 714/42 |
| 2006/0107186 A1* | 5/2006 | Cowell et al. | 714/776 |
| 2006/0206761 A1* | 9/2006 | Jeddeloh | 714/29 |
| 2007/0200579 A1 | 8/2007 | Jebbeloh et al. | 324/754 |

* cited by examiner

| WDATA FRAME # | F1 | F0 |
|---|---|---|
| 0 | 1 | WS0 |
| 1 | 1 | WS1 |
| 2 | 1 | WS2 |
| 3 | 1 | 0 |

| TRANSFER | BIT | | | | | | | | | |
|---|---|---|---|---|---|---|---|---|---|---|
| | 9 | 8 | 7 | 6 | 5 | 4 | 3 | 2 | 1 | 0 |
| 0 | aE0 | aE7 | aE8 | WSn | aC20 | aC16 | aC12 | aC8 | aC4 | aC0 |
| 1 | aE1 | aE6 | aE9 | F1=1 | aC21 | aC17 | aC13 | aC9 | aC5 | aC1 |
| 2 | aE2 | aE5 | aE10 | aE13 | aC22 | aC18 | aC14 | aC10 | aC6 | aC2 |
| 3 | aE3 | aE4 | aE11 | aE12 | aC23 | aC19 | aC15 | aC11 | aC7 | aC3 |
| 4 | FE21 | C17.D0 | C15.D0 | C13.D0 | C11.D0 | C9.D0 | C7.D0 | C5.D0 | C3.D0 | C1.D0 |
| 5 | FE20 | C17.D1 | C15.D1 | C13.D1 | C11.D1 | C9.D1 | C7.D1 | C5.D1 | C3.D1 | C1.D1 |
| 6 | FE19 | C17.D2 | C15.D2 | C13.D2 | C11.D2 | C9.D2 | C7.D2 | C5.D2 | C3.D2 | C1.D2 |
| 7 | FE18 | C17.D3 | C15.D3 | C13.D3 | C11.D3 | C9.D3 | C7.D3 | C5.D3 | C3.D3 | C1.D3 |
| 8 | FE17 | C18.D0 | C16.D0 | C14.D0 | C12.D0 | C10.D0 | C8.D0 | C6.D0 | C4.D0 | C2.D0 |
| 9 | FE16 | C18.D1 | C16.D1 | C14.D1 | C12.D1 | C10.D1 | C8.D1 | C6.D1 | C4.D1 | C2.D1 |
| 10 | FE15 | C18.D2 | C16.D2 | C14.D2 | C12.D2 | C10.D2 | C8.D2 | C6.D2 | C4.D2 | C2.D2 |
| 11 | FE14 | C18.D3 | C16.D3 | C14.D3 | C12.D3 | C10.D3 | C8.D3 | C6.D3 | C4.D3 | C2.D3 |

FIGURE 5

| XFR | BIT 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| 0 | C1.D0 | C2.D2 | C4.D0 | C5.D2 | C7.D0 | C8.D2 | C10.D0 | C11.D2 | C13.D0 | C14.D2 | C16.D0 | C17.D2 | E1.11 | E1.0 |
| 1 | C1.D1 | C2.D3 | C4.D1 | C5.D3 | C7.D1 | C8.D3 | C10.D1 | C11.D3 | C13.D1 | C14.D3 | C16.D1 | C17.D3 | E1.10 | E1.1 |
| 2 | C1.D2 | C3.D0 | C4.D2 | C6.D0 | C7.D2 | C9.D0 | C10.D2 | C12.D0 | C13.D2 | C15.D0 | C16.D2 | C18.D0 | E1.9 | E1.2 |
| 3 | C1.D3 | C3.D1 | C4.D3 | C6.D1 | C7.D3 | C9.D1 | C10.D3 | C12.D1 | C13.D3 | C15.D1 | C16.D3 | C18.D1 | E1.8 | E1.3 |
| 4 | C2.D0 | C3.D2 | C5.D0 | C6.D2 | C8.D0 | C9.D2 | C11.D0 | C12.D2 | C14.D0 | C15.D2 | C17.D0 | C18.D2 | E1.7 | E1.4 |
| 5 | C2.D1 | C3.D3 | C5.D1 | C6.D3 | C8.D1 | C9.D3 | C11.D1 | C12.D3 | C14.D1 | C15.D3 | C17.D1 | C18.D3 | E1.6 | E1.5 |
| 6 | C1.D0 | C2.D2 | C4.D0 | C5.D2 | C7.D0 | C8.D2 | C10.D0 | C11.D2 | C13.D0 | C14.D2 | C16.D0 | C17.D2 | E2.11 | E2.0 |
| 7 | C1.D1 | C2.D3 | C4.D1 | C5.D3 | C7.D1 | C8.D3 | C10.D1 | C11.D3 | C13.D1 | C14.D3 | C16.D1 | C17.D3 | E2.10 | E2.1 |
| 8 | C1.D2 | C3.D0 | C4.D2 | C6.D0 | C7.D2 | C9.D0 | C10.D2 | C12.D0 | C13.D2 | C15.D0 | C16.D2 | C18.D0 | E2.9 | E2.2 |
| 9 | C1.D3 | C3.D1 | C4.D3 | C6.D1 | C7.D3 | C9.D1 | C10.D3 | C12.D1 | C13.D3 | C15.D1 | C16.D3 | C18.D1 | E2.8 | E2.3 |
| 10 | C2.D0 | C3.D2 | C5.D0 | C6.D2 | C8.D0 | C9.D2 | C11.D0 | C12.D2 | C14.D0 | C15.D2 | C17.D0 | C18.D2 | E2.7 | E2.4 |
| 11 | C2.D1 | C3.D3 | C5.D1 | C6.D3 | C8.D1 | C9.D3 | C11.D1 | C12.D3 | C14.D1 | C15.D3 | C17.D1 | C18.D3 | E2.6 | E2.5 |

FIGURE 6

TESTING SYSTEM AND METHOD FOR MEMORY MODULES HAVING A MEMORY HUB ARCHITECTURE

TECHNICAL FIELD

This invention relates to memory systems in which a processor or other memory access device is coupled to a memory module having a memory hub or buffer coupled to several memory devices, and more particularly to a system and method for testing the memory module at full operating speed.

BACKGROUND OF THE INVENTION

Processor-based systems, such as computer systems, use memory devices, such as dynamic random access memory ("DRAM") devices, to store instructions and data that are accessed by a processor. These memory devices are typically used as system memory in a computer system. In a typical computer system, the processor communicates with the system memory through a processor bus and a memory controller. The processor issues a memory request, which includes a memory command, such as a read command, and an address designating the location from which data or instructions are to be read. The memory controller uses the command and address to generate appropriate command signals as well as row and column addresses, which are applied to the system memory. In response to the commands and addresses, data is transferred between the system memory and the processor. The memory controller is often part of a system controller, which also includes bus bridge circuitry for coupling the processor bus to an expansion bus, such as a PCI bus.

Although the operating speed of memory devices has continuously increased, this increase in operating speed has not kept pace with increases in the operating speed of processors. Even slower has been the increase in operating speed of memory controllers coupling processors to memory devices. The relatively slow speed of memory controllers and memory devices limits the data bandwidth between the processor and the memory devices.

In addition to the limited bandwidth between processors and memory devices, the performance of computer systems is also limited by latency problems that increase the time required to read data from system memory devices. More specifically, when a memory device read command is coupled to a system memory device, such as a synchronous DRAM ("SDRAM") device, the read data are output from the SDRAM device only after a delay of several clock periods. Therefore, although SDRAM devices can synchronously output burst data at a high data rate, the delay in initially providing the data can significantly slow the operating speed of a computer system using such SDRAM devices.

One approach to alleviating the limited data bandwidth and memory latency problems is to use multiple memory devices coupled to the processor through a memory hub. In a memory hub architecture, a system controller or memory hub controller is coupled to several memory modules, each of which includes a memory hub coupled to several memory devices. The system controller or memory hub controller is coupled to the memory module via a high-speed bus or link over which signals, such as command, address, or data signals, are transferred at a very high rate.

The very high rate at which command, address and write data signals are coupled to such memory modules and the very high rate at which read data signals are coupled from such memory modules make it difficult to test such memory modules at their normal operating speed. In particular, memory test systems are not generally available that are capable of operating at the normal operating speed of such devices.

One approach that has been used to test memory modules having a memory hub coupled to several memory devices is to include built-in test circuitry in the memory hub. However, this approach can unduly increase the cost of such memory modules, and the ease at which they may be re-configured to alter the manner in which tests are performed may be severely limited. Current methods do not test all functionality of the memory modules but instead normally test a limited range of the functions performed by the memory modules.

There is therefore a need for a method and system that allows memory modules having a memory hub coupled to several memory devices to be tested in the native mode that it will ultimately be used in its end application. This includes speed of operation as well as logical interface.

SUMMARY OF THE INVENTION

A testing method and system is used to test memory modules each of which has a memory hub coupled to a plurality of memory devices. The method and system includes a tester, a test interface circuit coupled to the tester, and at least one of the memory modules coupled to the test interface. The test interface circuit is operable to generate test signals and apply them to the memory hub in the memory module responsive to command, address and data signals received from the tester. The test interface circuit also receives signals from the memory hub in the memory module that are indicative of the response of the memory module to the test signals. The test interface circuit then provides corresponding results data to the tester. According to one aspect of the invention, error checking code bits corresponding to at least some of the command bits, address bits and write data bits from the tester are generated. These error checking code bits are combined with the command bits, address bits, write data bits to formulate a write packet that is applied to the memory module. The test interface circuit is also operable to receive a read packet from the memory module. The read packet comprises read data bits and error checking code bits corresponding to the read data bits. The test interface circuit is operable to determine if the error checking code bits correspond to the read data bits.

BRIEF DESCRIPTION OF THE DRAWINGS

FIG. 5 is a chart showing one example of a write data packet transmitted by the test interface circuit of FIG. 4.

FIG. 6 is a chart showing one example of a read data packet received by the test interface circuit of FIG. 4.

DETAILED DESCRIPTION OF THE INVENTION

Figure 1:
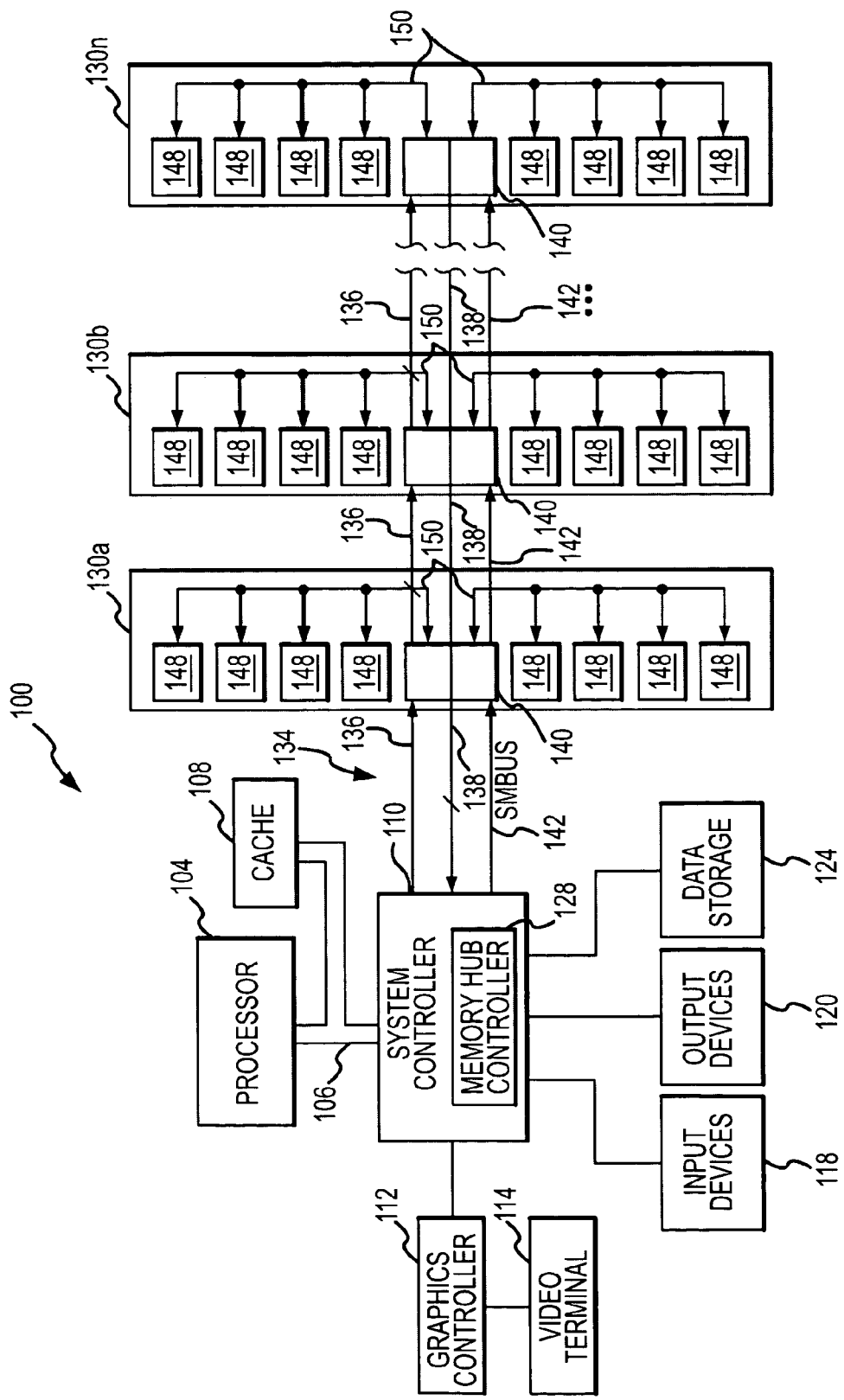
FIG. 1 is a block diagram of a one example of a computer system using a memory system including memory module having a memory hub coupled to several memory devices, which can be tested by systems and methods according to various examples of the invention.

A computer system 100 using a memory hub architecture is shown in FIG. 1. The computer system 100 includes a processor 104 for performing various computing functions, such as executing specific software to perform specific calculations or tasks. The processor 104 includes a processor bus 106 that normally includes an address bus, a control bus, and a data bus. The processor bus 106 is typically coupled to cache memory 108, which, is typically static random access memory ("SRAM"). Finally, the processor bus 106 is coupled to a system controller 110, which is also sometimes referred to as a bus bridge. The system controller 110 serves as a communications path to the processor 104 for a variety of other components. For example, as shown in FIG. 1, the system controller 110 includes a graphics port that is typically coupled to a graphics controller 112, which is, in turn, coupled to a video terminal 114. The system controller 110 is also coupled to one or more input devices 118, such as a keyboard or a mouse, to allow an operator to interface with the computer system 100. Typically, the computer system 100 also includes one or more output devices 120, such as a printer, coupled to the processor 104 through the system controller 110. One or more data storage devices 124 are also typically coupled to the processor 104 through the system controller 110 to allow the processor 104 to store data or retrieve data from internal or external storage media (not shown). Examples of typical storage devices 124 include hard and floppy disks, tape cassettes, and compact disk read-only memories (CD-ROMs).

The system controller 110 includes a memory hub controller 128 that is coupled to the processor 104. The memory hub controller 128 is further coupled over a high-speed link 134 to several memory modules 130a-n. In the system illustrated in FIG. 1, the link 134 includes a high-speed downstream bus 136 and a high-speed upstream bus 138. The high-speed downstream bus 136 couples command, address and write data signals away from the memory hub controller 128, and the high-speed upstream bus 138 couples read data signals and other signals, such as those identifying the request to which the read data is responsive, toward the memory hub controller 128. The memory hub 140 in each of the memory modules 130a-n is also coupled to the memory hub controller 128 through a system management bus ("SM-Bus") 142. The SMBus 142 allows the memory hub controller 128 to access various registers in the memory hub 140 for reasons that will be explained below.

Typically, the memory modules 130a-n are coupled in a point-to-point such that the memory modules 130a-n are connected one to another in series. Thus, the memory hub controller 128 is coupled to a first memory module 130a with the first memory module 130a connected to a second memory module 130b, and the second memory module 130b coupled to a third memory module 130c, and so on. Each memory module 130a-n includes a memory hub 140 that is coupled to the high-speed link 134, and is further coupled to a number of memory devices 148 through command, address and data buses, collectively shown as bus 150. The memory hub 140 efficiently routes memory requests and responses between the memory hub controller 128 and the memory devices 148. One example of a memory hub 140 is shown in U.S. patent application Ser. No. 10/747,984, filed Dec. 29, 2003, which is incorporated herein by reference.

Devices performing the function of the memory hub 140 are also known by other designations, such as an advanced memory buffer ("AMB"). Similarly, memory modules containing devices of this nature are also known by a variety of names, such as fully-buffered memory modules. In any case, the term "memory hub" is meant to refer to any device that does more than simply buffer register signals transmitted to or from the memory module but instead reformats memory requests and memory responses transferred between the memory hub controller 128 and the memory devices 148.

The memory devices 148 on the memory modules 130a-n are typically capable of operating at high clock frequencies in order to facilitate the relatively high speed operation of the overall memory system. Consequently, computer systems employing this architecture can also use the high-speed link 134 to complement the high clock speeds of the memory devices 148. Moreover, this architecture also provides for easy expansion of the system memory without concern for degradation in signal quality as more of the memory modules 130a-n are added, such as can occur in conventional memory bus architectures.

It will be appreciated that testing the memory hub 140 and the memory devices 148 of the memory modules 130a-n typically requires the use of test equipment that can accommodate the high speeds at which signals are transferred through the high-speed link 134. That is, the testers, test interface equipment, and the like should be designed to perform various tests on the memory hubs 140 and the memory devices 148 under typical operating conditions. For example, testers should be able to generate test signals, such as command, address, and data signals, with sufficient signal accuracy and at least at the speed under which the memory hubs 140 and the memory devices 148 operate in order to perform meaningful testing. Even if such test equipment is available, the economic costs to purchase this equipment is often very high. The burden is greatly increased in a manufacturing setting, where multiple units of test equipment are required to maintain adequate production throughput. Moreover it may be necessary to modify the test equipment or acquire new test equipment when designs for the memory hub 140 and/or memory devices 148 change significantly. Consequently, if the costs of the test equipment are prohibitive, the quality of memory device testing may be compromised or production output may suffer, neither of which is a desirable solution.

Figure 2:
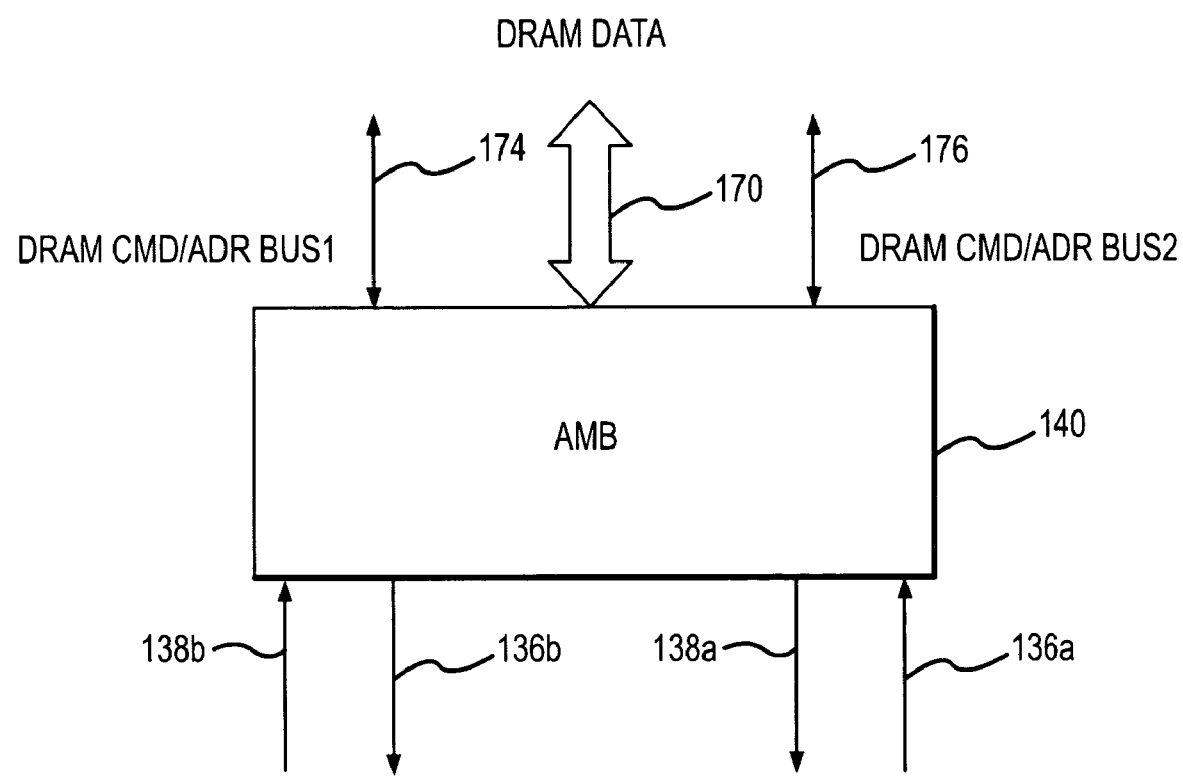
FIG. 2 is a block diagram of one example of a memory hub used in each of the memory modules in the computer system of FIG. 1 showing the interconnections to the memory hub.

The manner in which the memory hubs 140 interface with the high-speed link 134 will now be explained with reference to FIG. 2, which shows one of the memory hubs 140. The memory hub 140 interfaces with either the memory hub controller 128 (FIG. 1) or an upstream memory module 130a-n through a first of the downstream buses 136a and a first of the upstream buses 138a. The memory hub 140 may also interface with a downstream memory module 130a-n through a second of the downstream buses 136b and a second of the upstream buses 138b. The memory hub 140 interfaces with the memory devices 148 through a common bi-directional data bus 170, which is coupled to all of the memory devices 148. The memory hub 140 interfaces with four of the memory devices 148 in a first rank through a first command/address ("CMD/ADR") bus, 174, and it interfaces with four of the memory devices 148 in a second rank through a second command/address ("CMD/ADR") bus 176.

The manner in which the memory hub 140 shown in FIG. 2 can be used to create a relatively inexpensive high-speed tester that is customized to the particular memory hub 140 being tested will now be explained with reference to FIG. 3.

Figure 3:
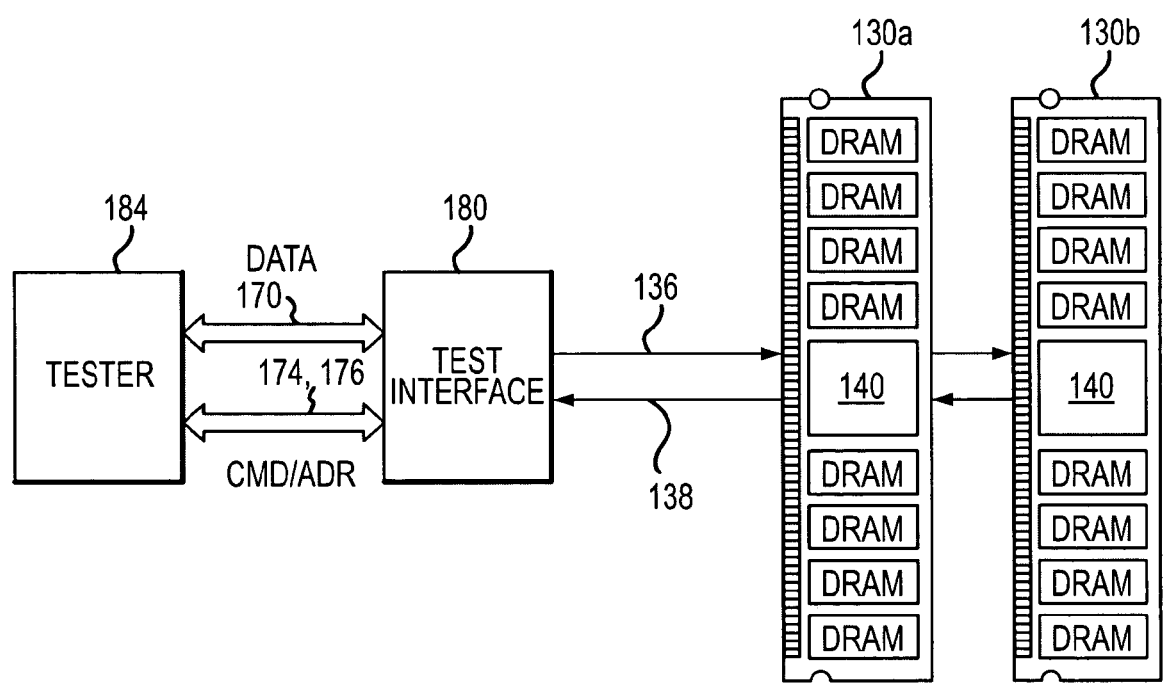
FIG. 3 is a block diagram of a testing system according to one example of the invention being used to test one of the memory modules used in the computer system of FIG. 1.

As shown in FIG. 3, a test interface system 180 is connected to two memory modules 130a,b through the high-speed downstream bus 136 and the high-speed upstream bus 138. The test interface system 180 may be implemented with an integrated circuit that is identical or substantially identical to one of the memory hubs 140 used in the memory modules 130. The test interface system 180 is also coupled to a tester 184 through the data bus 170 and the first and second CMD/ADR buses 174, 176. The first and second CMD/ADR buses 174, 176 together implement a bi-directional command/address bus to allow the test interface system 180 to allow information to be coupled between the test interface system 180 and tester 184 in both directions. The tester 184 may be a conventional stand-alone test system, a testing system fabricated as an integrated circuit, or a tester of some other nature. The tester 184 and the test interface system 180 may also be implemented as a single integrated circuit. In any case, the tester 184 generates signals that mimic those that would be generated by an AMB or any other system that would be communicating directly to memory devices 148. The memory hub 140 used as the test interface system 180 converts these memory device signals to high-speed signals of the type that would normally be coupled through the high-speed downstream bus 136 and the high-speed upstream bus 138. These signals can be expected to have the same speeds, format and other characteristics as the signals transmitted to and from the memory hubs 140 in the memory modules 130a,b. As a result, the test interface system 180 provides a "real-world" testing environment. Moreover, it does so at relatively little cost since the memory hubs 140 used for the test interface system 180 can be expected to be mass produced since they will be included in mass-produced memory modules 130. The tester 184 need not operate at the high speed at which the downstream bus 176 and the upstream bus 178 operates, and thus may be relatively inexpensive and well within the capabilities of conventional test systems. The tester 184 may also be an integrated test circuit of the type described in U.S. patent application Ser. No. 11/195,517 ("INTEGRATED TEST CIRCUIT LOAD BOARD AND METHOD HAVING ON-BOARD TEST CIRCUIT" Jeddeloh et al.,), which is incorporated herein by reference.

As explained above, the test interface system 180 can be simply one of the memory hubs 140 used in the memory modules 130. The test interface system 180 can also be substantially the same as the memory hubs 140, but can include some additional circuitry that is more specifically adapted to performing testing functions. Since such test interface system 180 is substantially the same as the memory hub 140, it can be expected to also provide a "real-world" test environment. Although such test interface system 180 may not be mass produced, it may still be relatively inexpensive since most of the design for the system 180, as well as the fabrication steps, will be common to the memory hubs 140.

Figure 4:
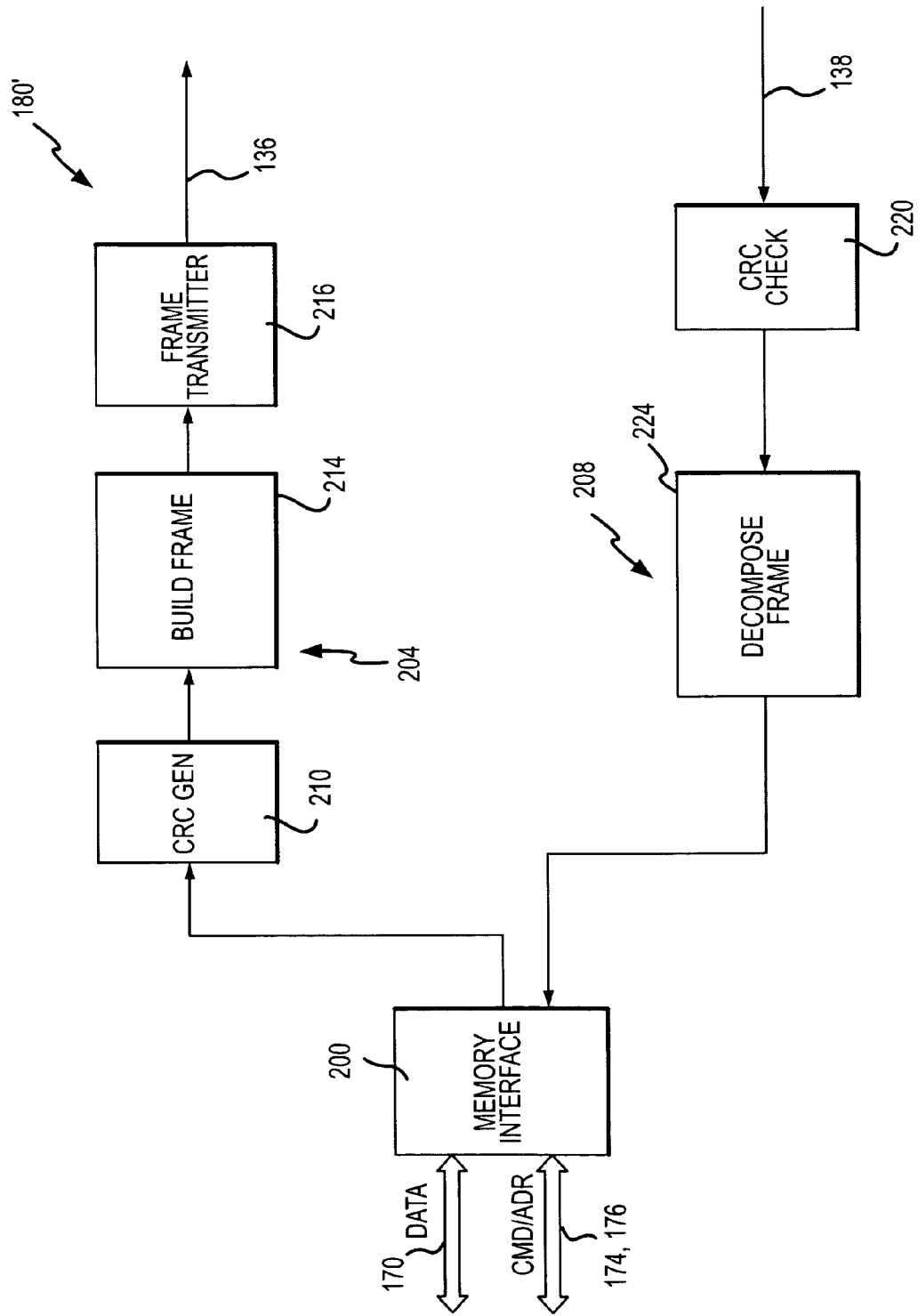
FIG. 4 is a block diagram of one example of a test interface circuit used in the testing system of FIG. 3.

An example of a test interface system 180' that can be used as shown in FIG. 3 is shown in FIG. 4. The test interface system 180' includes components other than those shown in FIG. 4, but those have been omitted in the interests of brevity and clarity since they are not particularly germane to testing. As shown in FIG. 4, test interface circuit 180' includes a memory interface 200 that is coupled to the common data bus 170 and the CMD/ADR buses 174, 176. The memory interface 200 is also coupled to downstream components 204 and upstream components 208. The memory interface 200 may include much of the same circuitry that is in the memory hubs 140 to convert command and address signals received from the tester 184 to signal packets containing command and address signals transmitted through the downstream bus 136. In the event of a write memory access, the signal packets containing command and address signals that are transmitted through the downstream bus 136 include write data signals. The memory interface 200 also converts signal packets containing read data coupled through the upstream bus 138 to read data signals, which are coupled from the memory interface 200 to the tester responsive to command and address signals.

The downstream components 204 include a cyclic redundancy generator 210, which generates error checking code bits in a conventional manner from signal packets transmitted from the memory interface 200. One example of a signal packet containing error checking code bits is shown in FIG. 5. As shown therein, the signal packet includes twelve 10-bit words, each of which is sequentially transmitted. Bits 5-0 of words 0-3 are command and address bits, bit 5 of word 0 identifies the memory module to which the packet is directed, and bit 5 of word 1 is a bit identifying whether a memory operation is a write or a read operation. Bits 9-7 of words 0-1 and bits 9-6 of words 2-3 are error checking code bits corresponding to the command and address bits, which are produced by the CRC generator 210. Bits 8-0 of words 4-11 are write data bits, and bit 9 of words 4-11 are error checking code bits corresponding to the write data bits 8-0 in the words 4-11, respectively. As explained below, the write data and corresponding error checking bits are stored in the memory devices 148 in one of the memory modules 130. The stored data and error checking bits are subsequently read, and the error checking bits are analyzed to determine if they correspond to the read data. If not, a memory read or write error is considered to be detected.

The signal packet shown in FIG. 5 is applied to a frame builder circuit 214, which formats the signals for transmission of the downstream bus 136. The signal packet is then applied to a frame transmitter 216 which transmits the packet through the high-speed downstream bus 136. The signal packet is then received by the memory hubs 140 in the memory modules 130 being tested.

The upstream components 208 receive read data packets through the upstream bus 138, and then processes the read data packets. An example of a read data packet is shown in FIG. 6. The signal packet includes twelve sequentially transmitted 14-bit words. The upstream data bus 138, at 14 bits, is thus slightly wider than the 10-bit downstream bus. Bits 11-0 of words 0-5 comprise a first frame of read data bits, and bits 13-12 of words 0-5 are error checking code bits corresponding to the read data bits 11-0 in the words 0-5, respectively. Similarly, bits 11-0 of words 6-11 comprise a second frame of read data bits, and bits 13-12 of words 6-11 are error checking code bits corresponding to the respective read data bits.

The upstream components 208 include a CRC checker 220 that analyzes the error checking code bits to determine if the read data bits correspond to the error checking code bits. If not, an error is considered to have occurred in either transferring the write data to one of the memory devices 148, storing the write data in one of the memory devices 148, retaining the stored data in one of the memory devices 148, reading the stored data from one of the memory devices 148, or transferring the read data from one of the memory devices 148. The read data in the packet is then applied to a frame decomposer 224, which extracts the read data bits from the packets. These read data bits are then applied to the memory interface 200. The memory interface 200 outputs the read data bits responsive to command and address signals of the type that are typically applied to the memory devices 148 in the memory modules 130. The tester 184 then analyzes these signals to determine if the memory modules 130 are functioning properly.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

What is claimed is:

1. A system for testing at least one memory module having a memory hub coupled to a communications link and a plurality of memory devices coupled to the memory hub, the system comprising:
    a tester coupled having a memory bus, the tester being operable to transfer memory signals to and from the memory bus; and
    a test interface circuit having a memory interface coupled to the tester through the memory bus, the test interface circuit being coupled to the at least one memory module through the communications link, the test interface circuit being operable to couple test signals to the memory hub in the memory module through the communications link responsive to command, address and data signals received from the tester, the test interface circuit further being operable to receive signals from the memory hub in the memory module through the communications link indicative of the response of the memory module to the test signals and to provide corresponding results data to the tester, wherein the test interface circuit comprises:
        a memory interface coupled to the tester through a data bus and at least one command and address bus;
        a cyclic redundancy generator coupled to receive signals from the memory interface and operable to generate error checking code signals corresponding thereto;
        a frame builder circuit coupled to receive the signals from the memory interface and the error checking code signals from the cyclic redundancy generator and to convert the signals to a write signal packet; and
        a frame transmitter coupled to receive the write signal packet from the frame builder, the frame transmitter being operable to transmit the write signal packet to the at least one memory module through the communications link.

2. The system of claim 1 wherein the test interface circuit comprises circuitry that is substantially identical to circuitry in the memory hub in the at least one memory module.

3. The system of claim 2 wherein the test interface circuit comprises circuitry that is identical to circuitry in the memory hub in the at least one memory module.

4. The system of claim 1 wherein the test interface circuit is operable to convert a read data packet received from the at least one memory module through the communications link to read data signals, the tester being coupled to receive the read data signals from the test interface circuit responsive to command and address signals applied by the tester to the test interface circuit.

5. The system of claim 1 wherein the test interface circuit is coupled to receive command, address and write data signals from the tester and to convert the command, address and write data signals to a write data packet, the test interface circuit being operable to apply the write data packet to the at least one memory module through the communications link.

6. The system of claim 1 wherein the test interface circuit further comprises:
    a cyclic redundancy checker coupled to the at least one memory module through the communications link, the cyclic redundancy checker being operable to receive a read data packet from the at least one memory module containing read data signals and error checking code signals and to determine if the read data signals correspond to the error checking code signals; and
    a frame decomposer coupled to receive the read data packet and to apply signals corresponding to the read data packet to the memory interface.

7. The system of claim 1 wherein the communications link comprises:
    a high-speed downstream bus coupling signals from the test interface circuit to the at least one memory module; and
    a high-speed upstream bus coupling signals from the at least one memory module to the test interface circuit.

8. The system of claim 7 wherein the high-speed upstream bus has a width that is greater than the width of the high-speed downstream bus.

9. The system of claim 1 wherein the memory bus comprises a bi-directional data bus and a bi-directional command/address bus.

10. A system for testing at least one memory module having a memory hub coupled to a communications link and a plurality of memory devices coupled to the memory hub, the system comprising:
    a tester coupled having a memory bus, the tester being operable to transfer memory signals to and from the memory bus; and
    a test interface circuit having a memory interface coupled to the tester through the memory bus, the test interface circuit being coupled to the at least one memory module through the communications link, the test interface circuit being operable to couple test signals to the memory hub in the memory module through the communications link responsive to command, address and data signals received from the tester, the test interface circuit further being operable to receive signals from the memory hub in the memory module through the communications link indicative of the response of the memory module to the test signals and to provide corresponding results data to the tester, wherein the test interface circuit comprises:
        a cyclic redundancy checker coupled to the at least one memory module through the communications link, the cyclic redundancy checker being operable to receive a read data packet from the at least one memory module containing read data signals and error checking code signals and to determine if the read data signals correspond to the error checking code signals; and
        a frame decomposer coupled to receive the read data packet and to apply signals corresponding to the read data packet to the memory interface.

11. The system of claim 10 wherein the test interface circuit comprises circuitry that is substantially identical to circuitry in the memory hub in the at least one memory module.

12. The system of claim 11 wherein the test interface circuit comprises circuitry that is identical to circuitry in the memory hub in the at least one memory module.

13. The system of claim 10 wherein the test interface circuit is operable to convert a read data packet received from the at least one memory module through the communications link to read data signals, the tester being coupled to receive the read data signals from the test interface circuit responsive to command and address signals applied by the tester to the test interface circuit.

14. The system of claim 10 wherein the test interface circuit is coupled to receive command, address and write data signals from the tester and to convert the command, address and write data signals to a write data packet, the test interface circuit being operable to apply the write data packet to the at least one memory module through the communications link.

15. The system of claim 10 wherein the communications link comprises:
   a high-speed downstream bus coupling signals from the test interface circuit to the at least one memory module; and
   a high-speed upstream bus coupling signals from the at least one memory module to the test interface circuit.

16. The system of claim 15 wherein the high-speed upstream bus has a width that is greater than the width of the high-speed downstream bus.

17. The system of claim 10 wherein the memory bus comprises a bi-directional data bus and a bi-directional command/address bus.

* * * * *